United States Patent [19]
Ishii

[11] Patent Number: 6,088,279
[45] Date of Patent: Jul. 11, 2000

[54] SEMICONDUCTOR MEMORY DEVICE WITH DUMMY WORD LINE

[75] Inventor: Toshiji Ishii, Nara, Japan

[73] Assignee: Sharp Kabushiki Kaisha, Osaka, Japan

[21] Appl. No.: 09/300,004

[22] Filed: Apr. 26, 1999

[30] Foreign Application Priority Data

Apr. 27, 1998 [JP] Japan ................................. 10-116334

[51] Int. Cl.[7] .................................................. G11C 7/02
[52] U.S. Cl. ...................................... 365/210; 365/233.5
[58] Field of Search .................................. 365/210, 214, 365/233, 233.5

[56] References Cited

U.S. PATENT DOCUMENTS 5,301,157  4/1994  Roberts ................................. 365/210
5,999,482  12/1999  Kornachuk et al. .................... 365/210

FOREIGN PATENT DOCUMENTS 60-76095  4/1985  Japan .

*Primary Examiner*—Vu A. Le
*Attorney, Agent, or Firm*—Morrison & Foerster LLP

[57] ABSTRACT

A semiconductor memory device includes a plurality of word lines and a plurality of bit lines arranged in a matrix and memory cells provided at intersections of the plurality of word lines and the plurality of bit lines. A dummy word line for detecting a low to high transition of a word line is provided parallel to the word line. By providing a dummy word line longer in length than a word line or the like to increase the delay in transition of the dummy word line, a reference potential to be detected can be set lower than conventional to reduce variation in detection timing.

6 Claims, 10 Drawing Sheets

SEMICONDUCTOR MEMORY DEVICE WITH DUMMY WORD LINE

BACKGROUND OF THE INVENTION

1. Field of the Invention

The present invention relates to semiconductor memory devices and in particular to those capable of rapid operation.

2. Description of the Background Art

As semiconductor integrated device technology has developed, the elements and interconnects formed on a semiconductor substrate have been increasingly microfabricated and increasing the storage capacity has been contemplated. In such semiconductor memory devices, in order to achieve rapid access time a transition (a rising) of a dummy word line providing the identical operation to a word line can be detected to time a read operation or the like. For example, Japanese Patent Laying-Open No. 60-76095 describes an example which applies this technique to a DRAM.

FIG. 2 is a simple block diagram of a semiconductor memory device provided with a detection technique using a conventional dummy word line. FIG. 3 shows an example of circuit configuration specifically showing a portion thereof FIG. 4 represents a waveform of operation. While an example is herein described using a mask ROM, which is relatively simple in configuration, the present invention is not limited thereto.

Referring to FIGS. 2–4, in the conventional mask ROM, addresses Ai, Ai+1 and the like input external to the chip are input to an address buffer 1. Address buffer 1 detects a transition of each address and outputs a pulsed signal ATD to a timing generator 10. Signal ATD is generated when any address changes. Timing generator 10 refers to signal ATD to generate various internal signals and operates in internal synchronization. Address buffer 1 also outputs internal address signals ADi, ADi/ and the like to an address decoder 2. When address decoder 2 receives the internal address signals, it drives a word line 6 and outputs a column select signal to a column selector 8. In response to the column select signal, column selector 8 selects a predetermined bit line 5 (a column). Thus in a memory cell array 3 a memory 4 specified by word line 6 and bit line 5 is read out.

Timing generator 10 receives signal ATD to generate various timing signals. For example, it generates an internal signal CKP to precharge, equalize and the like a bit line, and it also generates an internal signal OHZ (an output enable signal) to activate an output buffer 13. A sense amplifier 9 precharges and equalizes a bit line when internal signal CKP is held high, and sense amplifier 9 provides sensing and amplification when internal signal CKP is held low. More specifically, in response to a signal generated by timing generator 10, sense amplifier 9 precharges and equalizes a bit line selected by column selector 8 and senses and amplifies data of the bit line. Output buffer 13 outputs an output from sense amplifier 9 to outside the chip when internal signal OHZ is held low, and output buffer 13 places an output terminal in high impedance state when internal signal OHZ is held high.

A dummy word line drive circuit 11 responds to a start signal ATDX output from timing generator 10 to drive a dummy word line 7 at the same timing as address decoder 7 drives a word line, ant it inactivates dummy word line 7 in response to an internal signal RSDWL. A detector 12 detecting a low to high transition of a dummy word line outputs a detection signal PRE when it detects that dummy word line 7 attains a predetermined reference potential.

FIG. 5 shows an exemplary circuit configuration of detector 12 detecting a low to high transition of a dummy word line. Dummy word line detection circuit 12 compares a potential of dummy word line DWL to a predetermined reference potential VREF2 at an end of the dummy word line to generate a detection signal PRE. In this configuration, detection signal PRE is held low when dummy word line DWL is of low level (DWL<VREF2), and detection signal PRE is rapidly inverted high when the potential of dummy word line DWL gradually increases and matches the reference potential (DWL=VREF2). It should be noted that reference potential VREF2 is determined depending on a resistance obtained by dividing resistances R3 and R4. For example, for R3=2 kΩ and R4=8 kΩ, VREF2=(4/5)Vcc. When detection signal PRE goes high, it can be determined that the potential of word line WL has increased sufficiently. Thus, internal signal CKP is set low to terminate precharging and equalization and also allow a sense amplifier to read a value of a bit line. When the sense amplifier is reading it, the output terminal is held in high impedance (HiZ) state by internal signal OHZ. At a timing when the read completes, internal signal OHZ is set low and internal signal RSDWL is also set high. When internal signal RSDWL goes high, dummy word line drive circuit 11 allows dummy word line DWL to rapidly transition inactive low. When the potential of dummy word line DWL drops below the predetermined reference potential VREF2, dummy word line detection circuit 12 inverts detection signal PRE to low.

Thus, the detection of a low to high transition of dummy word line, the termination of precharging and equalization, the provision of a read operation by a sense amplifier, and the provision a series of operations to stop the sense amplifier after the read completes can reduce current consumption.

In the conventional mask ROM, 1-bit information is previously stored in one memory transistor 4 fabricated according to a mask pattern in manufacturing it. The information is read by sensing via sense amplifier 9 whether memory transistor 4 accessed is ON or OFF. Since the aforementioned microfabrication of devices reduces the memory transistor 4 drive current, the reading level will further be reduced. In order to maximize the memory transistor 4 drive current, word line 6 coupled with the gate of memory transistor 4 should have a sufficiently high level (a level close to the Vcc level). When word line 6 is a wiring layer containing, e.g., conductive polysilicon, however, the resistance value thereof is larger than that of a metal or aluminum wire and also varies in manufacturing word line 6. Thus it is difficult to determine whether the level of the end of word line 6 has risen to a predetermined level when word line 6 is accessed. Thus, rather than detect a low to high transition of the level at the end of word line 6, dummy word line 7 identical in structure to a word line is generally employed to detect a level at an end of dummy word line 7 via dummy word line detector 12.

Hereinafter, to readily understand the present invention, identical circuits and the like in the description and the drawings are denoted by same reference characters.

A rising waveform of such a conventional dummy word line DWL is the same as that of word line WL. Thus, for example, when a sufficient rise in level at an end of a word line, i.e., a rise to voltage VREF2 is adapted to be detected, as shown in FIG. 6, a variation ΔV of reference voltage VREF2 due to a variation in manufacture, a variation in temperature or the like results in a variation ΔT2 of detection signal PRE and reference VREF2 closer to the power supply potential disadvantageously increases ΔT2 if ΔV does not change. Since access time of a semiconductor memory device should be defined depending on the worst case (the worst value), it is difficult to rapidly operate the semiconductor memory device. Selecting a rapidly operating device also results in reduction in yield.

SUMMARY OF THE INVENTION

One object of the present invention is therefore to provide a semiconductor memory device with a dummy word line that is capable of providing rapid access time.

Another object of the present invention is to provide a semiconductor memory device with a dummy word line that can provide high yield and rapid access time.

Still another object of the present invention is to provide a semiconductor memory device with a dummy word line free of access time variation due to variation in manufacturing it.

The above objects of the present invention are achieved by a semiconductor device including the following elements. That is, the semiconductor memory device according to the present invention includes a plurality of word lines arranged in a first direction, a plurality of bit lines arranged in a second direction traverse to the first direction, a plurality of memory cells arranged at intersections of the plurality of word lines and the plurality of bit lines, an address receiving element receiving an address for specifying a predetermined memory cell among the plurality of memory cells, a dummy word line connected to the address receiving element and arranged in the same direction as a word line, and a dummy word line driver. When the dummy word line attains a predetermined potential, it is determined that the word line has attained a predetermined operation level and a predetermined process is applied to a memory cell. The semiconductor memory device includes a detector connected to the address receiving element and determining whether the dummy word line attains the predetermined potential, and a loader increasing a load of the dummy word line, as compared to that of the word line.

Since the load of the dummy word line is larger than that of the word line, the level of the dummy word line rises more slowly than the waveform of the word line rises. When the level of the word line has risen sufficiently, that of the dummy word line has not yet risen sufficiently, the reference potential can be set lower than that for a conventional dummy word line and a region larger in gradient of waveform will be detected. Thus, time variation of a detection signal can also be reduced for approximately the same variation in reference voltage.

Still preferably, the dummy word line driver is provided adjacent to the address receiving element, and the detector is arranged on the same side as the dummy word line driver. Since the detector and the dummy word line driver are arranged on the same side, the load of the dummy word line can readily be adjusted.

Preferably, the dummy word line is longer in length than the word line or the dummy word line is narrower in line width than the word line. Preferably, a distance between a dummy word line and a word line adjacent and parallel thereto or another dummy word line adjacent and parallel thereto is shorter than a distance between word lines. A plurality of dummy word lines each equal in length to the word line may be connected together in series to provide the resulting dummy word line longer in the entire length than the word line, or a plurality of dummy word lines each shorter in length than the word line may be connected together in series to provide the resulting dummy word line longer in the entire length than the word line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the embodiments of the present invention will now be described more specifically, with reference to the drawings.

(1) First Embodiment

Figure 1:
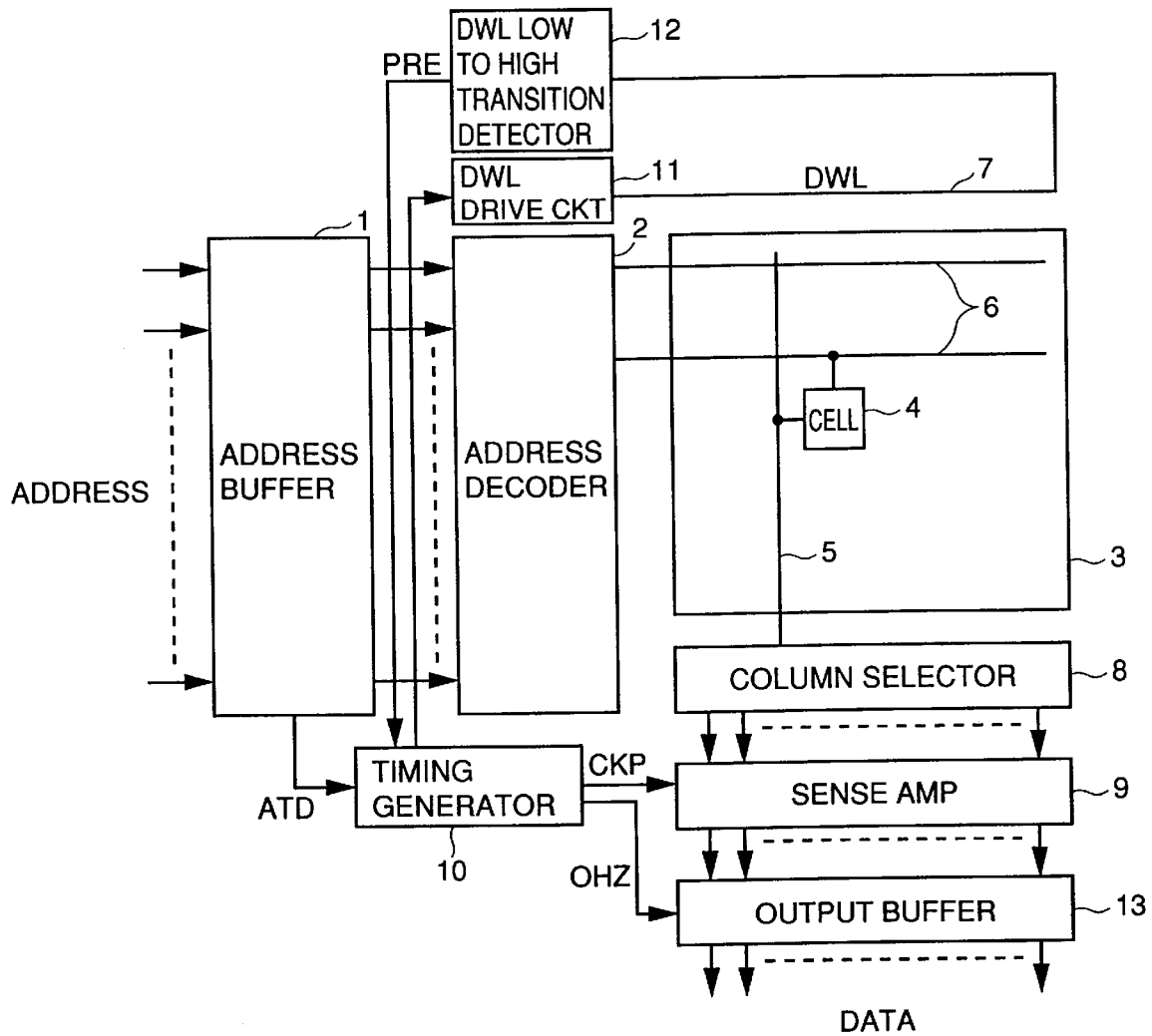
FIG. 1 is a block diagram showing a mask ROM of a first embodiment of the present invention.
Figure 2:
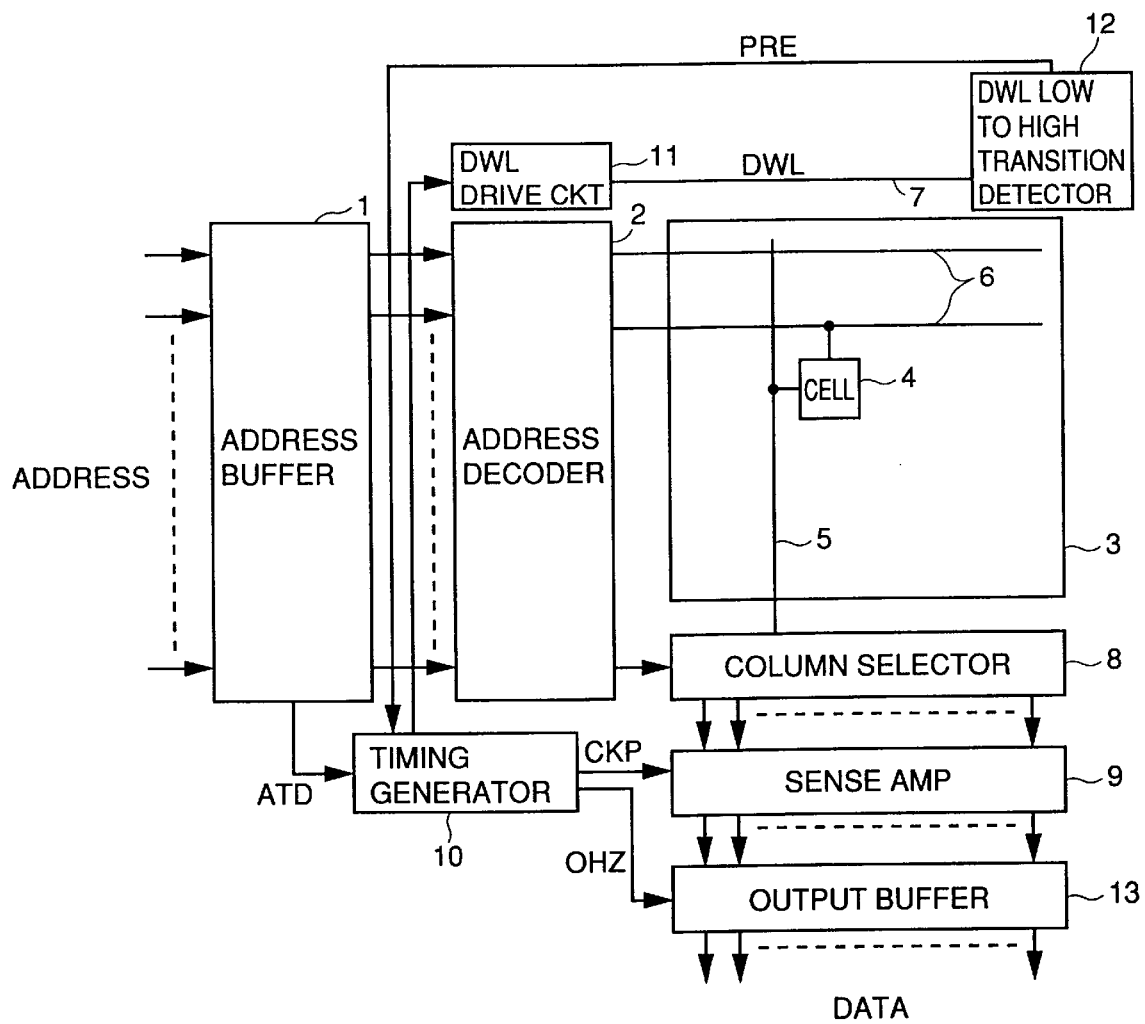
FIG. 2 is a block diagram showing a conventional mask ROM.
Figure 3:
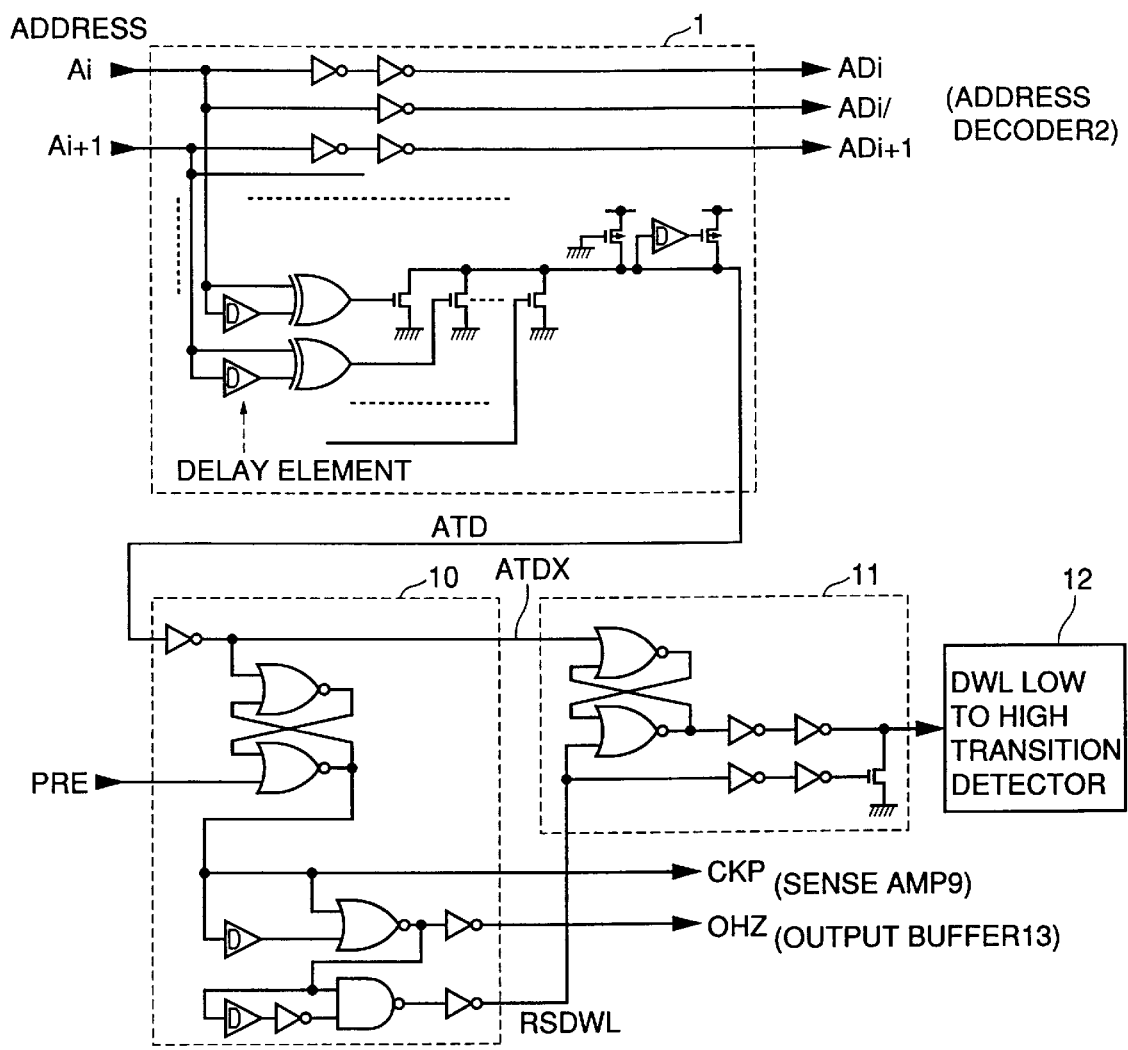
FIG. 3 is a circuit diagram showing an exemplary circuit configuration of a portion of a mask ROM.
Figure 4:
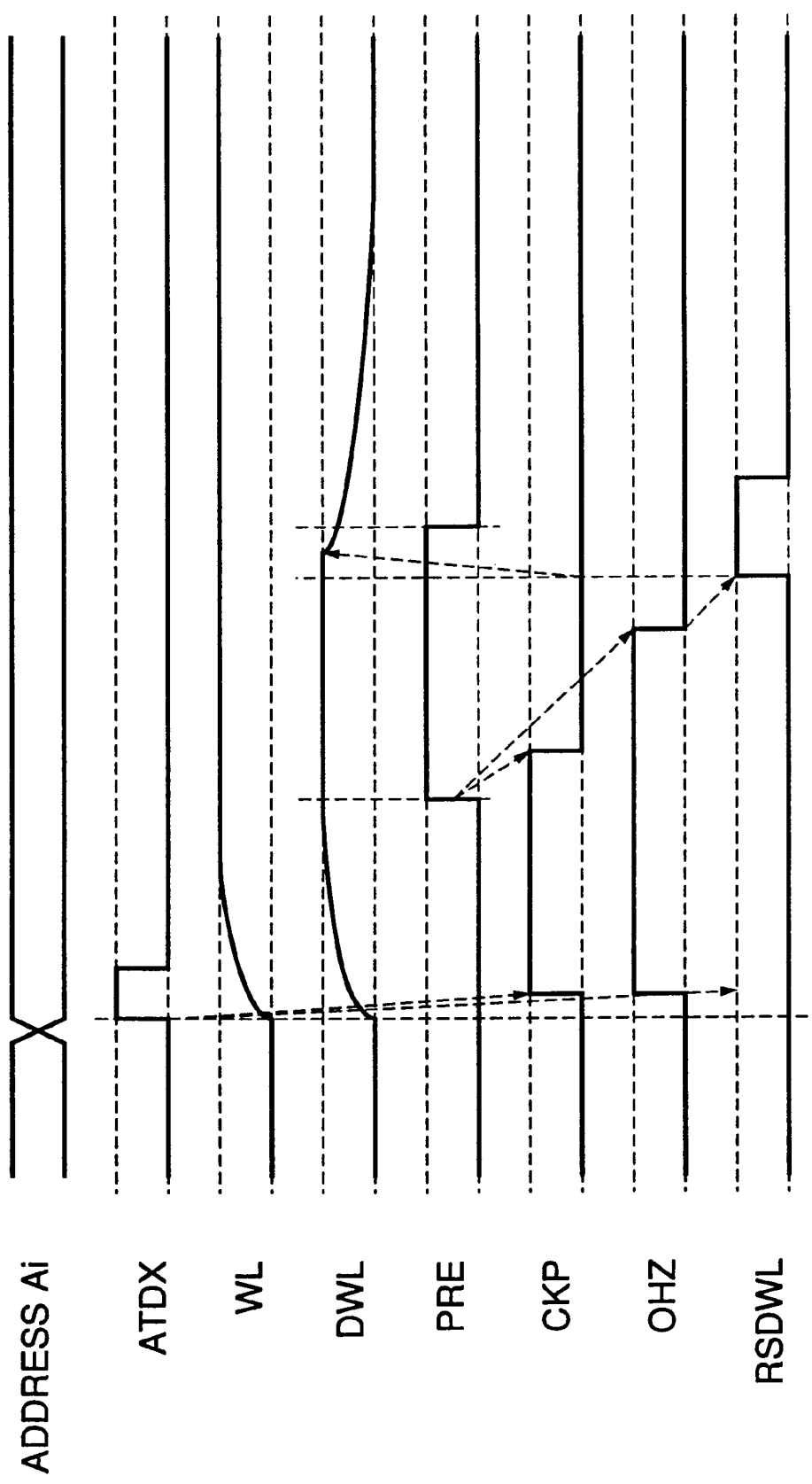
FIG. 4 is a timing diagram representing an exemplary operation timing of a conventional mask ROM.
Figure 5:
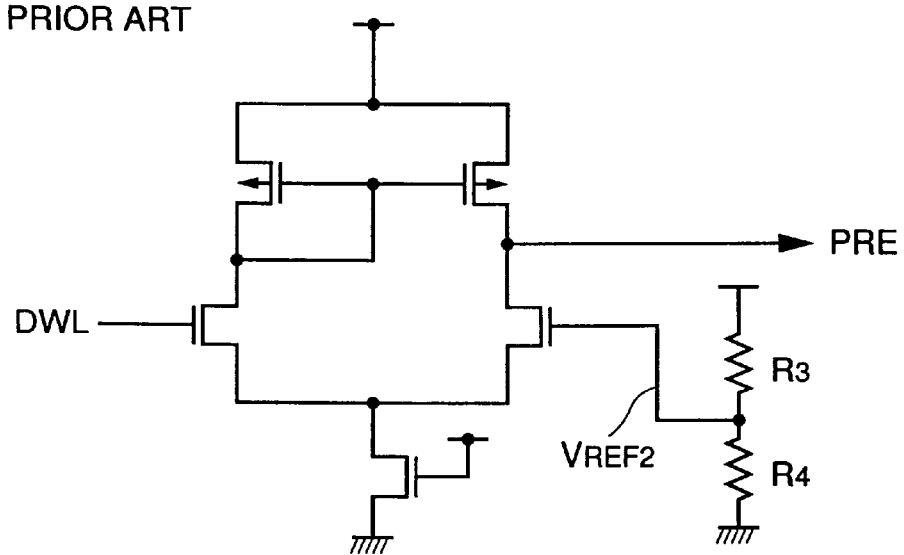
FIG. 5 is a circuit diagram of a dummy word line detection circuit used for a conventional mask ROM.
Figure 6:
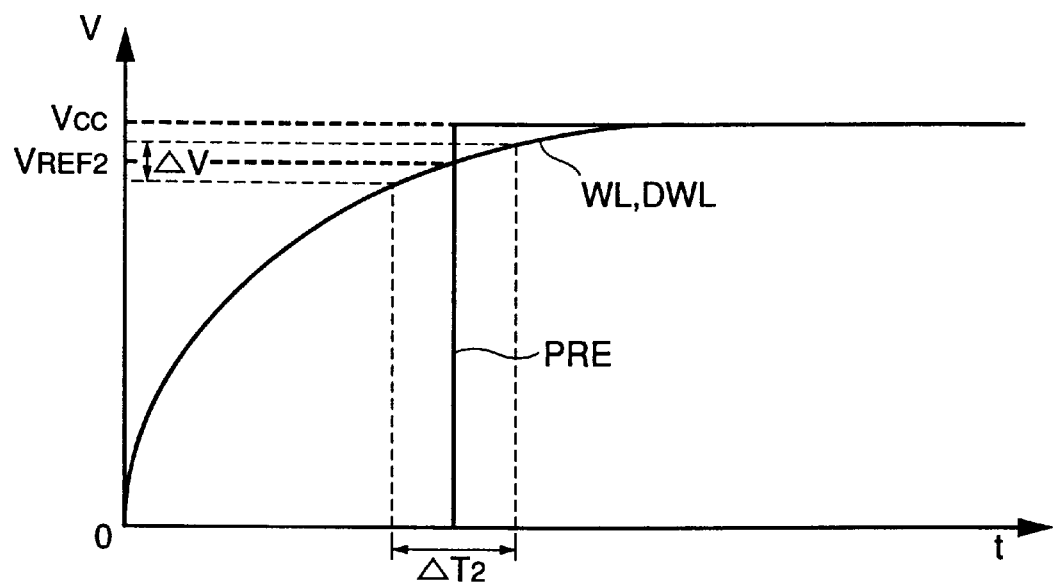
FIG. 6 represents a result of simulation of a dummy word line detection circuit when a conventional dummy word line is used.
Figure 7:
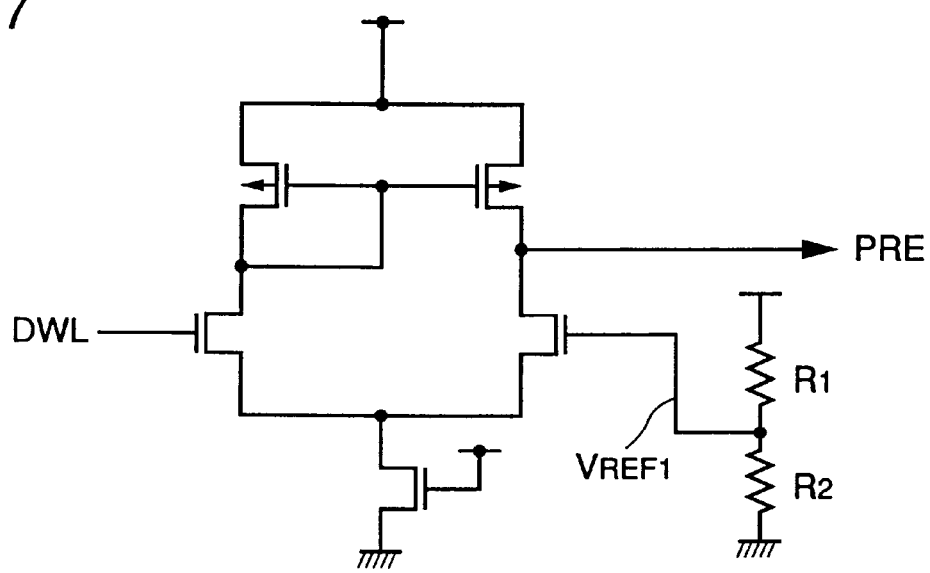
FIG. 7 is a circuit diagram of a dummy word line detection circuit used in an embodiment of the present invention.
Figure 8:
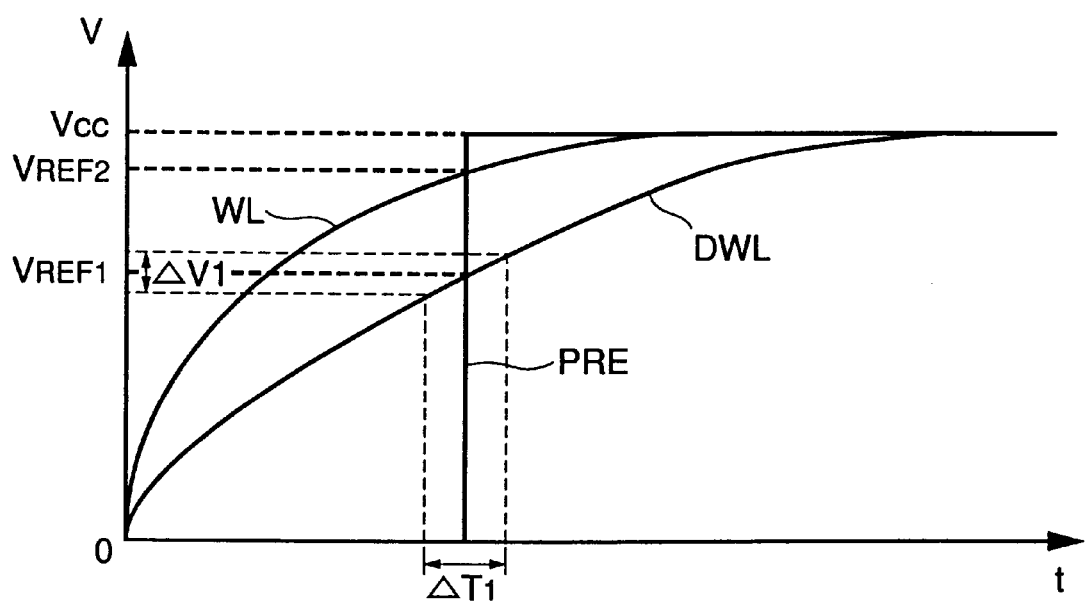
FIG. 8 represents a result of simulation of a dummy word line detection circuit when a dummy word line of the present invention is used.
Figure 9:
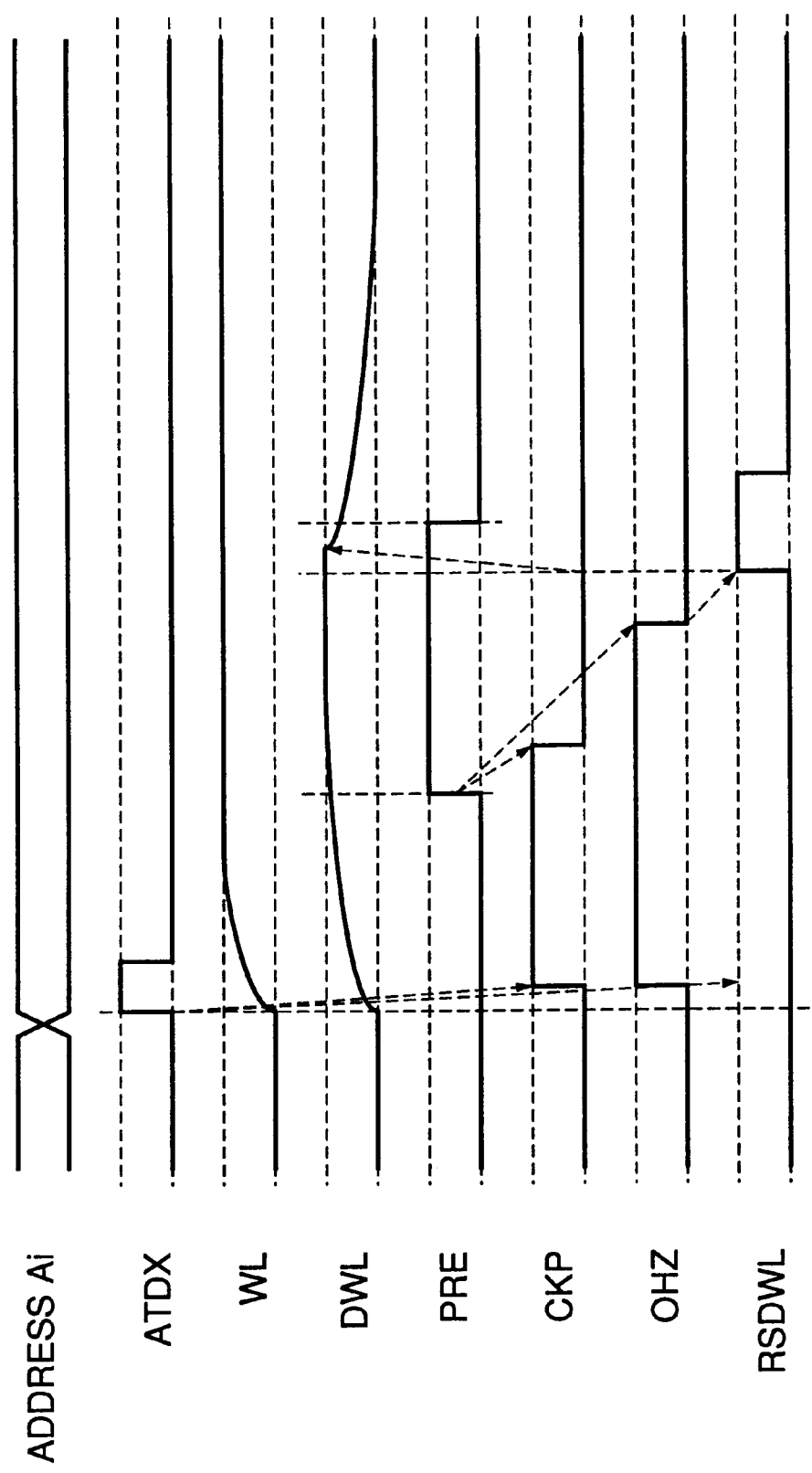
FIG. 9 is a timing diagram representing an exemplary operation timing of a mask ROM according to the present embodiment.

A first embodiment of the present invention will now be described. FIG. 1 is a block diagram showing a mask ROM of the first embodiment in accordance with the present invention. FIG. 7 is a circuit diagram showing a dummy word line detection circuit detecting a low to high transition of a dummy word line. FIG. 8 is a result of simulation of a dummy word line detection circuit when a dummy word line of the present invention is used. FIG. 9 represents a waveform of operation.

In FIG. 7, the ratio of divided resistance values to generate a different reference potential VREF1 should be different from that of divided resistance values to generate a conventional reference potential VREF2. For example, while a conventional ratio thereof is such that R3:R4=2:8, a ratio thereof to generate reference potential VREF1 is adjusted to be R1:R2=4:6. It should also be noted that the ratio of resistances is adjusted as appropriate depending on the load applied to the dummy word line (determined by the load capacitance and resistance of the dummy word line).

As shown in FIG. 1, according to the first embodiment, a length of dummy word line 7 is twice that of word line 6. Thus, the load of dummy word line 7 is larger than that of word line 6. Thus, the level of dummy word line 7 rises more slowly than that of word line 6, as shown in FIG. 8. Thus, when word line 6 has a sufficiently raised level of VREF2, dummy word line 7 has an insufficient raised level of VREF1. To use the characteristic to detect the time at which word line 6 attains the sufficiently raised level of VREF2, a reference voltage of dummy word line detection circuit 12 need only be set at VREF1. When reference voltage VREF1 varies by $\Delta V1$ due to a variation in manufacture, a variation in temperature and the like, detection signal PRE varies by $\Delta T1$. It is also apparent from FIG. 8 that as compared to reference voltage VREF2 provided when a conventional dummy word line is used, reference voltage VREF1 is adapted to be an insufficiently raised level of dummy word line 7, so that variation $\Delta T1$ of detection signal PRE can be reduced for a same variation of $\Delta V$ ($\Delta T1<\Delta T2$).

(2) Second Embodiment

While in the first embodiment a low to high transition of a dummy word line is delayed as compared to that of a word line by providing the dummy word line longer in length than the word line to increase the resistance value thereof, a similar effect is contemplated in the second embodiment by providing a dummy word line narrower in line width than a word line to increase the resistance value thereof.

Narrowing the dummy word line results in reduced load capacitance thereof. However, since the capacitance is greatly affected by a sidewall of a wire of the dummy word line, the rate of reduction in the capacitance is smaller than that of increase in the resistance. Consequently, the product of the resistance and the capacitance increases and a (low to high) transition of the dummy word line is delayed.

(3) Third Embodiment

Figure 10:
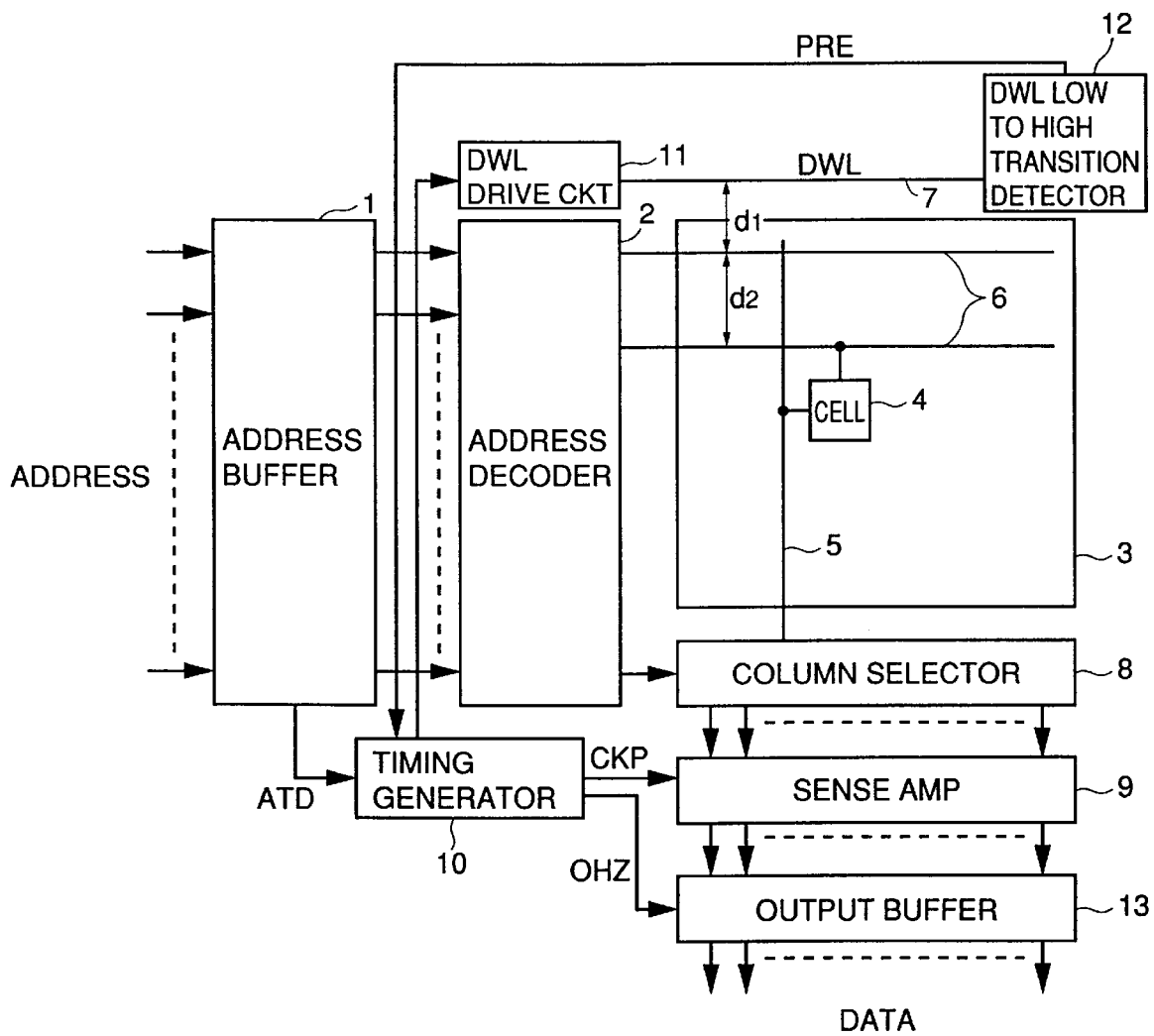
FIG. 10 is a block diagram of a mask ROM of a third embodiment of the present invention.

While in the first embodiment a low to high transition of a dummy word line is delayed, as compared to that of a word line, by providing the dummy word line longer in length than the word line to increase the resistance value thereof, a similar effect may be obtained by providing a shorter distance dl between dummy word line 7 and word line 6 or another dummy word line that is parallel and adjacent to dummy word line 7 thank a distance d2 between word lines 6, as shown in FIG. 10, to provide a larger parasitic capacitance between dummy word line 7 and word line 6 or another dummy word line that is parallel to and adjacent to dummy word line 7 than a parasitic capacitance between word lines 6.

While a spacing of word line 6 is determined by its relation to the arrangement of memory cell 4, dummy word line 7 is not subject to such a limitation. Thus, a spacing between interconnects thereof can relatively readily be changed.

(4) Fourth Embodiment

Figure 11:
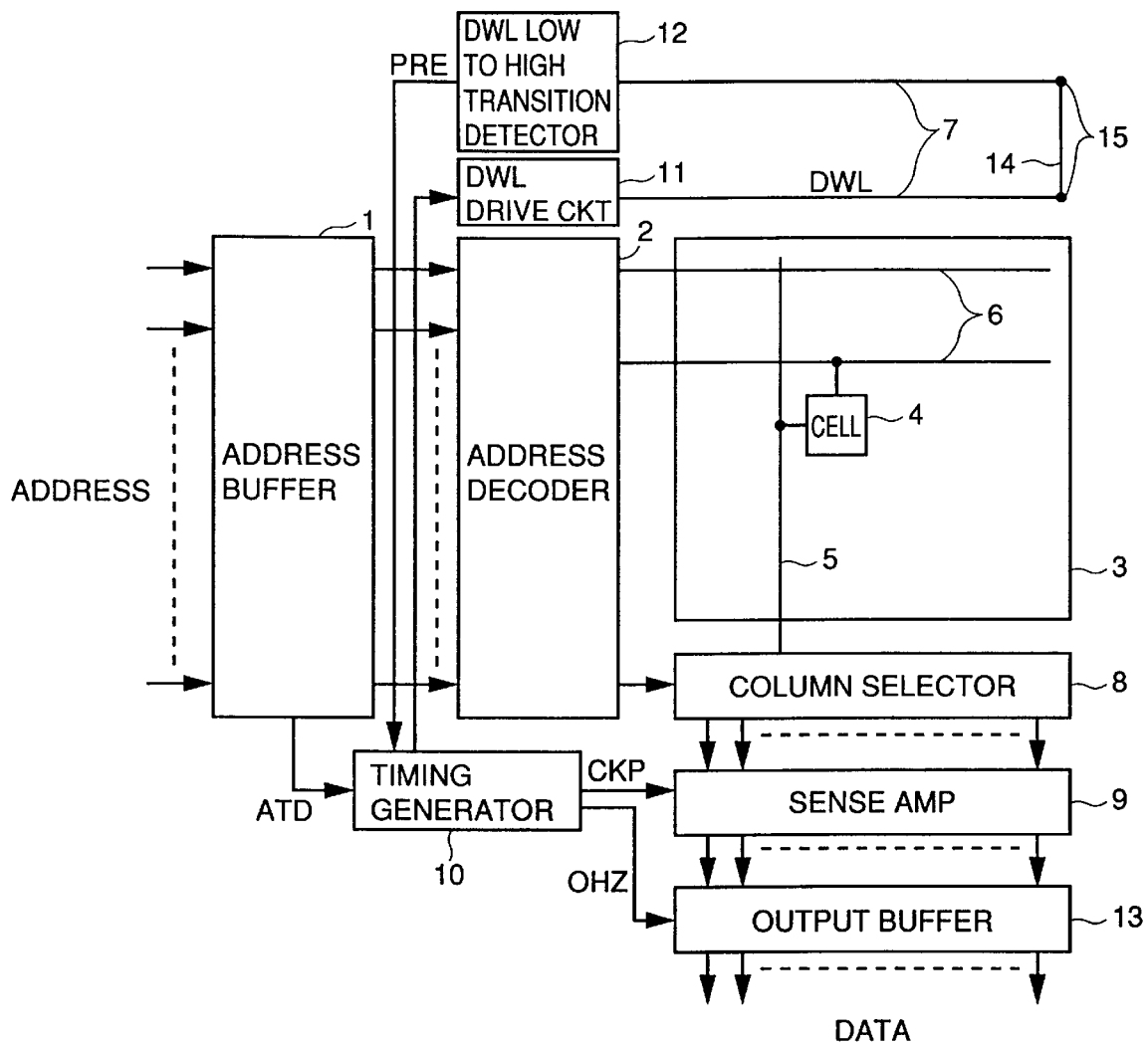
FIG. 11 is a block diagram of a mask ROM of a fourth embodiment of the present invention.
Figure 12:
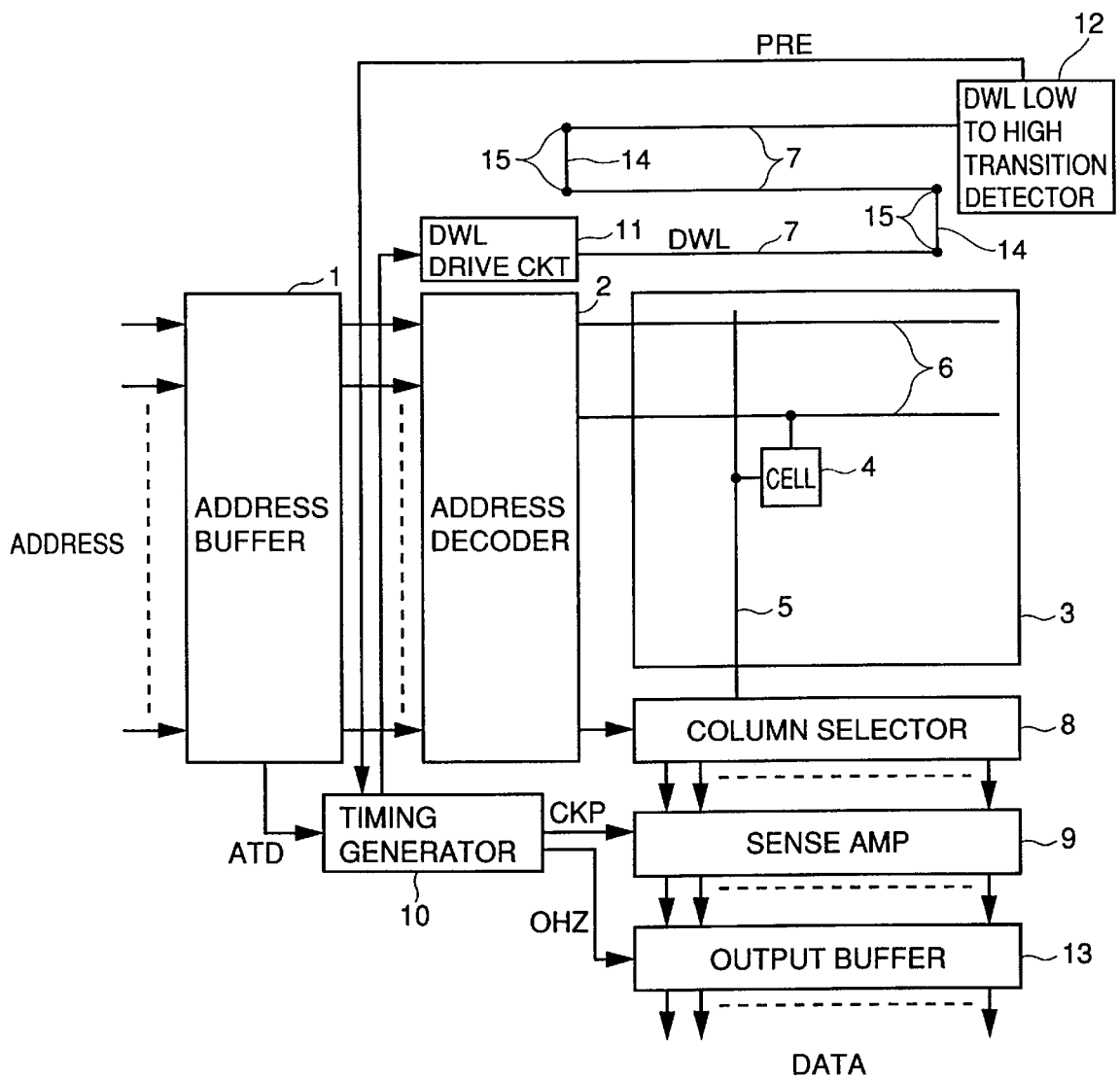
FIG. 12 is a block diagram of a mask ROM of the fourth embodiment of the present invention.

While in the first embodiment a low to high transition of a dummy word line is delayed, as compared to that of a word line, by providing the dummy word line longer in length than the word line to increase the resistance value thereof, a similar effect may be obtained by providing as a dummy word line 7 a plurality of dummy word lines each equal to or shorter than word line 6 in length and connected together in series via contact 15 using a wiring layer 14 (e.g., an aluminum wiring layer) different from a layer used for the dummy word line (in this example, a wiling layer containing conductive polysilicon), as shown in FIGS. 11 and 12, to provide dummy word line 7 longer in length than the word line to increase the resistance value thereof.

While typically a dummy word line is identical in material to a word line (i.e., polysilicon), a metal wire inserted in a dummy word line allows delay in transition of the dummy word line to be adjusted at a later manufacturing step. More specifically, a metal wire 14, 14 shown in FIG. 12 can be short-circuited to substantially reduce a dummy word line, and since in the typical semiconductor manufacturing process the metal wiring step is provided after the polysilicon step, delay of the memory can be adjusted in a stage at which the manufacturing process has further proceeded. Thus, access time can be set considering process variation in manufacturing semiconductor memory devices and the like, and the yield can also be increased.

(5) Fifth Embodiment

As shown in FIG. 10, dummy word line detector 12 can be connected to dummy word line 7 at an end thereof opposite to a dummy word line driver 11 to obtain maximal delay.

As shown in FIG. 1 or 11, when dummy word line detector 12 and dummy word line driver 11 are arranged on a same single side of memory cell array 3 and a dummy word line is folded back and thus wired, the dummy word line can be short-circuited (via contact 15 and metal wire 14) at any location between parallel portions of the dummy word line without changing other layout patterns to readily set delay in transition of the dummy word line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of word line arranged in a first direction;

a plurality of bit lines arranged in a second direction traverse to said first direction;

a plurality memory cells provided at intersections of said plurality of word lines and said plurality of bit lines;

a means receiving an address for specifying a predetermined memory cell among said plurality of memory cells;

a dummy word line connected to said address receiving means and arranged in a same direction as said word line is arranged;

a means driving said dummy word line, wherein when said dummy word line attains a predetermined potential, determination is made that said word line has attained a predetermined operating level and a predetermined process is applied to said memory cell;

a means connected to said address receiving means, determining whether said dummy word line has attained said predetermined potential; and a loading means providing a larger load of said dummy word line than a load of said word line.

2. The semiconductor memory device according to claim 1, wherein said loading means provides said dummy word line longer in length than said word line.

3. The semiconductor memory device according to claim 2, wherein said loading means serially connects a plurality of dummy word lines each equal to or shorter than said word line in length to form a dummy word line longer in general than said word line.

4. The semiconductor memory device according to claim 1, wherein said loading means reduce a line width of said dummy word line, as compared to a line width of said word line.

5. The semiconductor memory device according to claim 1, wherein said loading means reduces a distance between said dummy word line and a word line adjacent to said dummy word line or another dummy word line adjacent to said dummy word line, as compared to a distance between word lines.

6. The semiconductor memory device according to claim 1, wherein:

said dummy word driver is provided adjacent to said address receiving means; and said loading means arranges said detection means on a same side as said dummy word line driver.

* * * * *